United States Patent
Ikeda et al.

(10) Patent No.: US 7,538,718 B2
(45) Date of Patent: May 26, 2009

(54) RADAR SYSTEM

(75) Inventors: Hiroshi Ikeda, Tokyo (JP); Takeshi Yokoyama, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 12/010,623

(22) Filed: Jan. 28, 2008

(65) Prior Publication Data

US 2008/0180313 A1 Jul. 31, 2008

(30) Foreign Application Priority Data

Jan. 30, 2007 (JP) ............................ 2007-019830
Mar. 30, 2007 (JP) ............................ 2007-091302

(51) Int. Cl.
*G01S 7/40* (2006.01)
*G01S 13/00* (2006.01)
*G01S 7/00* (2006.01)

(52) U.S. Cl. ...................... 342/173; 342/27; 342/82; 342/89; 342/165; 342/175; 342/195

(58) Field of Classification Search .................. 342/27, 342/28, 82–103, 165–175, 195, 118, 128–145, 342/200–205
See application file for complete search history.

(56) References Cited

U.S. PATENT DOCUMENTS

| | | | | |
|---|---|---|---|---|
| 2,526,595 | A * | 10/1950 | Watts, Jr. ...................... | 342/173 |
| 2,854,663 | A * | 9/1958 | Maynard ...................... | 342/173 |
| 2,897,490 | A | 7/1959 | Sunstein | |
| 3,932,870 | A * | 1/1976 | Shapiro et al. ............... | 342/173 |
| 4,225,866 | A * | 9/1980 | Levine ........................ | 342/173 |
| 4,274,095 | A | 6/1981 | Phipps et al. | |
| 4,727,596 | A | 2/1988 | Jaffer | |
| 4,739,351 | A * | 4/1988 | Feldman ..................... | 342/169 |
| 4,870,701 | A | 9/1989 | Ito et al. | |
| 5,841,393 | A * | 11/1998 | Saito et al. ................... | 342/165 |
| 5,854,603 | A | 12/1998 | Heger | |
| 5,994,965 | A | 11/1999 | Davis et al. | |
| 6,369,747 | B1 * | 4/2002 | Ashihara ..................... | 342/165 |
| 6,825,799 | B2 * | 11/2004 | Isaji ............................ | 342/173 |
| 7,002,511 | B1 | 2/2006 | Ammar et al. | |
| 7,034,745 | B2 * | 4/2006 | Isaji ............................ | 342/173 |
| 7,064,703 | B2 * | 6/2006 | Jordan et al. ................ | 342/132 |

(Continued)

FOREIGN PATENT DOCUMENTS

EP 0 825 455 A2 2/1998

(Continued)

*Primary Examiner*—Bernarr E Gregory
(74) *Attorney, Agent, or Firm*—Oliff & Berridge, PLC

(57) ABSTRACT

Detection of failure mode peculiar to a high-electron mobility transistor is available. A control circuit controls a gate voltage switching portion so that the gate voltage applied to a transistor may become a given checking voltage. The checking voltage may be set to a pinch-off-voltage of the transistor, for example. The control circuit detects a current value of the drain current flown when the checking voltage is applied, thereby detecting a failure of the transistor based on the current value. According to the present invention, since failure detection is made on the basis of the drain current value flown when the checking voltage set up apart from an operating voltage is applied as the gate voltage, failure mode which is peculiar to the high electron mobility transistor and which is hardly detectable in an ordinary operating state becomes detectable.

10 Claims, 10 Drawing Sheets

U.S. PATENT DOCUMENTS

| | | |
|---|---|---|
| 2003/0155651 A1 | 8/2003 | Ammar |
| 2004/0113833 A1* | 6/2004 | Lee .......................... 342/175 |
| 2006/0055585 A1* | 3/2006 | Nagasaku et al. ........... 342/118 |

FOREIGN PATENT DOCUMENTS

| | | |
|---|---|---|
| JP | A-61-192131 | 8/1986 |
| JP | A-03-138576 | 6/1991 |
| JP | A-05-327354 | 12/1993 |
| JP | A 06-043236 | 2/1994 |
| JP | A 06-59023 | 3/1994 |
| JP | A 10-062525 | 3/1998 |
| JP | A 2004-080865 | 3/2004 |
| JP | A-2004-080865 | 3/2004 |
| WO | WO 98/04016 | 1/1998 |
| WO | WO 99/04284 | 1/1999 |

* cited by examiner

Vg vs Id (WITH DRAIN CURRENT LIMITING RESISTANCE)

Vg vs Gm (IN NORMAL)

RADAR SYSTEM

CROSS REFERENCE TO RELATED APPLICATIONS

The present invention contains subject matter related to Japanese Patent Application JP 2007-091302 filed in the Japanese Patent Office on Mar. 30, 2007, the entire contents of which being incorporated herein by reference.

BACKGROUND OF THE INVENTION

1. Field of the Invention

The present invention relates to a radar system which includes an electronic circuit using a high electron mobility transistor, and is typically used as a vehicle-mounted radar.

2. Description of the Related Art

In the related art, there is known a radar system that measures the distance to a detection target based on a time after transmission of a wave till reception of the wave reflected from the detection target. There is also known a radar system that detects a relative velocity to the detection target using the Doppler effect. There is further provided a radar system further having a function of position detection by use of a frequency-modulated carrier wave. Such kind of radar systems have been typically used as a vehicle-mounted radar to measure the relative distance and relative velocity to an obstacle such as a preceding automobile or the like. Such radar systems including the vehicle-mounted radar are obliged to use a limited frequency band regulated by law, and generally using a microwave, a submillimeter wave, or a millimeter wave. In many cases, electronic circuits for such frequencies use a semiconductor device of compound semiconductor. In particular, such semiconductor device as what is called HEMT (high electron mobility transistor) having good high frequency characteristic is commonly used.

Japanese Patent Publication No. 10-62525 discloses a method for implementing failure detection for high frequency circuit components in a radar system outputting a frequency-modulated transmission wave. Japanese Patent Publication No. 2004-80865 discloses a method for implementing failure detection for semiconductor devices by measuring a temperature thereof. In the above-mentioned failure detection methods, failure of a circuit component is detected when there is a certain abnormality found in the circuit component in its ordinary operation. Namely, failure detection for the circuit component is implemented while the device is operated in its ordinary operating state.

SUMMARY OF THE INVENTION

However, HEMT has a peculiar failure mode. As a result, in the related art of implementing detection failure during an ordinary operation, such peculiar failure mode may not be detected with certainty for some reason even when there is actually a failure or trouble. Examples of the failure detection for HEMT include a method where a resistance for drain current detection is inserted between a drain electrode and a power supply of HEMT so as to monitor drain current flown at the time of the ordinary operation. However, HEMT has a peculiar failure mode that cannot be discovered by such method of continuously monitoring the drain current flown at the ordinary operation mode, as described later.

FIG. 12 shows a gate voltage Vg (abscissa) versus drain current Id (coordinate) characteristic for a trouble-free HEMT. FIG. 13 shows a gate voltage Vg (abscissa) versus drain current Id (coordinate) for a failure HEMT (in failure mode). In the case of trouble-free HEMT, as shown in FIG. 12, if the absolute value of the gate voltage Vg exceeds a specified voltage (pinch-off-voltage Vp), the drain current Id becomes approximately zero and is hardly flown. In the case of failure HEMT with trouble, as shown in FIG. 13, the drain current Id does not become zero and unnecessary current flows even when the gate voltage Vg reaches the pinch-off-voltage Vp. Generally, the HEMT is operated with an idling current flowing constantly. For example, in amplifying circuits (modulator and so on) in the transmitter, operating voltage V1 as shown in FIGS. 12 and 13 is applied as a gate voltage Vg at the time of ordinary operations. With such operating voltage V1 applied, there appears little difference in the values of drain current Id between the trouble-free HEMT of FIG. 12 and the failure HEMT of FIG. 13. Namely, even if HEMT goes into failure mode in the ordinary operating state, the value of the drain current Id hardly differs. Thereby failure detection is difficult only by monitoring the current difference. For this reason, in the related art, there is a risk of using a failure HEMT as it is without knowing. In order to improve operation safety for a vehicle-mounted radar system, it is desirable that failure detection of the radar system is available prior to actual operation. In addition, it will be more convenient if the HEMT can be operated as usual, even in any failure mode, by taking some measures.

The present invention has been devised in view of the above problem, and it is desirable to provide a radar system capable of detecting a failure mode peculiar to a high electron mobility transistor.

In accordance with an embodiment of the present invention, there is provided a radar system for detecting a detection target by emitting a transmission wave and receiving a reflected wave reflected from the detection target. The radar system includes at least one electronic circuit using a high electron mobility transistor, and the electronic circuit has switching means for switching a gate voltage to be applied to the high electron mobility transistor, between an operating voltage and a checking voltage, detection means for detecting the current value of a drain current in the high electron mobility transistor under application of the checking voltage, and determination means for determining occurrence of failure in the high electron mobility transistor by comparing the detected current value with a first reference value.

In the radar system of an embodiment of the present invention, the checking voltage is set up apart from the operating voltage and is selectively applied as the gate voltage for the high electron mobility transistor. Then the current value of the drain current of the high electron mobility transistor, which is flown when the checking voltage is applied, is detected. Whether the high electron mobility transistor has a failure or not is determined by comparing the detected current value with the first reference value. In this manner, unlike the related art of implementing failure detection in the ordinary operation state, failure detection is implemented with use of the checking voltage set up apart from the operating voltage, thereby failure modes peculiar to the high electron mobility transistor become detectable.

Preferably, the radar system of an embodiment of the present invention may further include control means for implementing a switching control for the switching means so that the control means may control the switching means to apply the operating voltage as the gate voltage for the high electron mobility transistor when the determination means determined that no failure occurs. In this manner, actual operation of the circuit is started after confirming no failure, thereby improving the safety for the actual operation of the electronic circuit.

Preferably, in the radar system of an embodiment of the present invention, the determination means may compare the detected current value with a second reference value, and if the current value exceeds the first reference value and is not over the second reference value, the determination means determined that a failure mode peculiar to the high electron mobility transistor has occurred. Preferably, the radar system of an embodiment of the present invention may further include a peripheral circuit connected to the high electron mobility transistor directly or indirectly. Then, the determination means may compare the detected current value with the second reference value, and if the current value exceeds the second reference value, the determination means determines that failure has occurred in both of the high electron mobility transistor and the peripheral circuit. In these cases, the second reference value is typically set to a maximum current value (Idss) the trouble-free high electron mobility transistor can take. If the detected current value is larger than Idss, there is a possibility that failure may have occurred not only in the high electron mobility transistor but also in the peripheral circuit, thereby such failure state is detected.

Preferably, in the radar system of an embodiment of the present invention, the checking voltage may be set to the value of a pinch off voltage or between the pinch off voltage and a maximum rated voltage of the high electron mobility transistor, for example. In the case of normal high electron mobility transistor, since the amount of the drain current Id is zero (hardly flown) at the pinch off voltage, detection of a failure mode peculiar to the high electron mobility transistor becomes easy.

Preferably, in the radar system of an embodiment of the present invention, the operating voltage is a voltage within a first voltage region where gradient of a characteristic curve indicative of mutual conductance versus gate voltage for the high electron mobility transistor is positive. Such voltage in the range of the first voltage region where gradient of the characteristic curve of the mutual conductance is positive is generally used in a mixer circuit provided in the receiver for receiving the reflected wave.

Preferably, in the radar system of an embodiment of the present invention, the switching means may further has a function of switching the operating voltage between a voltage in a first voltage region where gradient of a characteristic curve indicative of mutual conductance versus gate voltage for the high electron mobility transistor is positive, and another voltage in a second voltage region distinct from the first voltage region. When it is determined by the determination means that failure has occurred in the high electron mobility transistor, the control means may control the switching means to apply as its operating voltage a voltage in the second voltage region as gate voltage for the high electron mobility transistor. In this case, it is preferred that the second voltage region is set to a field where gradient of the characteristic curve is negative. More preferably, the second voltage region is set to a field where gradient of the characteristic curve is negative maximum. In this manner, even if failure occurs in the high electron mobility transistor when it is used, for example in the mixer circuit, it becomes possible to obtain the same conversion gain as the time of being operated within the first voltage region by switching the operation voltage from the first voltage region to the suitably-defined second voltage region. Thereby, it becomes possible for the electronic circuit to avoid deterioration in performance even at the time of failure.

EFFECTS OF THE INVENTION

In the radar system of the present invention, unlike the related art of implementing a failure detection in the ordinary operation state, failure detection is implemented based on the current value of drain current flown when the checking voltage, which is set up apart from the operating voltage, is applied as the gate voltage. In this manner, failure mode peculiar to the high electron mobility transistor, which is hardly detectable in the ordinary operation state, can be detected. Accordingly, when it is used as a vehicle-mounted radar for example, failure detection prior to actual operation is available, thereby improving safety for operation.

Other and further objects, features and advantages of the invention will appear more fully from the following description.

DESCRIPTION OF THE PREFERRED EMBODIMENTS

Embodiments of the present invention will be described in detail hereinbelow with reference to the drawings.

First Embodiment

Figure 1:
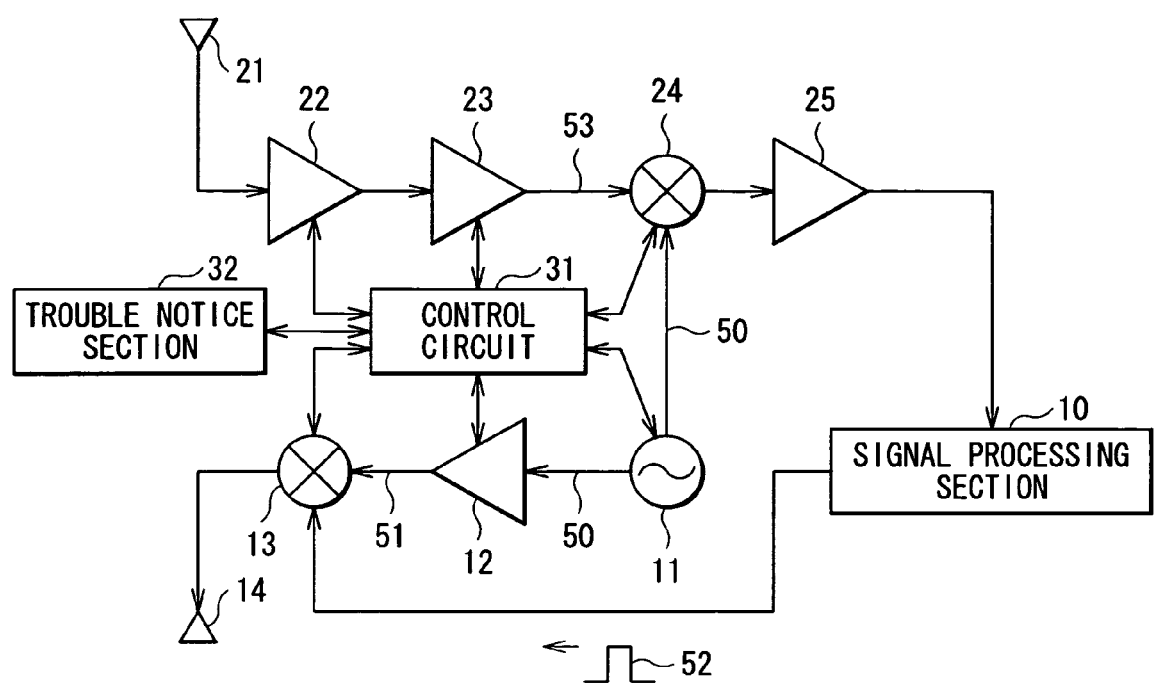
FIG. 1 is a block diagram showing one configuration example of a radar system according to a first embodiment of the present invention.

FIG. 1 shows one configuration example of a pulse radar system according to a first embodiment of the present invention. This radar system can be used, for example, as a vehicle-mounted radar.

The radar system includes a signal processing section 10 for generating a modulated pulse signal 52 for transmission and analyzing a received pulse, etc., a local oscillator 11 for generating a local oscillation wave 50 with a predetermined frequency, a transmission amplifier 12 which amplifies the local oscillation wave 50 generated by the local oscillator 11 to provide a carrier wave 51 for transmission, a modulator 13 that implements a pulse modulation of the carrier wave 51 with the modulated pulse signal 52 to generate a transmission pulse signal, and a transmission antenna 14 that emits the transmission pulse signal as a transmission wave. The radar system further includes: a receiving antenna 21 that receives a reflected wave reflected from a not shown detection target among the transmission waves transmitted as a wave from the transmission antenna 14, and then outputs the received wave as a received pulse signal; and a two-staged high-frequency amplifiers 22 and 23 for amplifying the received pulse signal. The radar system further includes: a mixer 24 that demodulates an amplified received pulse signal 53 with the local oscillation wave 50 emitted from the local oscillator 11; and an intermediate frequency amplifier 25 for amplifying the demodulated received pulse signal. The radar system further includes: a control circuit 31 for typically detecting a failure of a high frequency circuit portion disposed in the radar system; and an trouble notice section 32 for notification in case of the failure detection. The control circuit 31 has a current value calculation section 31A and a failure determination section 31B as will be described later in FIG. 2.

In this radar system, the modulated pulse signal 52 for transmission is outputted from a pulse generator disposed in the signal processing section 10. The carrier wave 51, which is generated by the local oscillator 11 and amplified by the transmission amplifier 12, is then pulse-modulated by the modulator 13 with use of the modulated pulse signal 52 to generate the transmission pulse signal. The transmission pulse signal is emitted as a transmission wave of a radio wave, towards the not-illustrated detection target from the transmission antenna 14. The receiving antenna 21 receives the reflected wave reflected from the not-illustrated detection target and outputs it as the received pulse signal. The received pulse signal is inputted into the signal processing section 10 after demodulated and amplified through the high-frequency amplifiers 22 and 23, the mixer 24 and the intermediate frequency amplifier 25. The signal processing section 10 can detect the detection target and calculate the distance thereto by analyzing the received pulse signal. Specifically, the round-trip propagation time from the radar system to the detection target is calculated based on the time difference of the transmission timing of the transmitted pulse signal and the reception timing of the received pulse signal. Then the round-trip distance from the radar system to the detection target can be calculated by multiplying the value of the round-trip propagation time by the velocity of light.

Here, the local oscillator 11, the transmission amplifier 12, the modulator 13, the high-frequency amplifiers 22 and 23, and the mixer 24 are all serving as components of the high frequency circuit portion in this radar system, each including an HEMT. Then each of the components of the high frequency circuit portion constitutes an component element of an "electronic circuit" according to the present invention. In the present embodiment, each of the components of the high frequency circuit portion corresponds to a specific example of the "electronic circuit" in the present invention.

Figure 2:
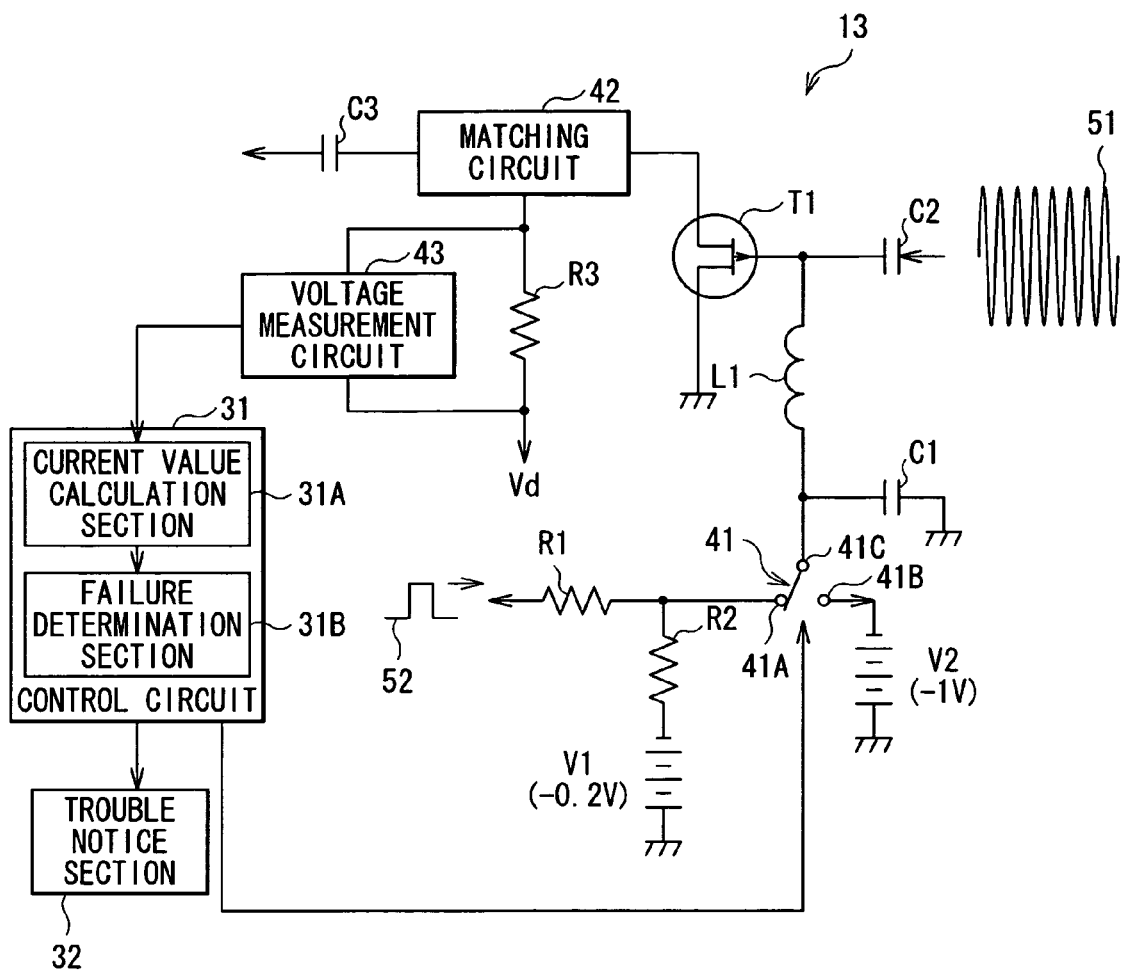
FIG. 2 is a circuit diagram showing one configuration example of an electronic circuit in the radar system according to the first embodiment of the present invention.

FIG. 2 shows a specific configuration of the modulator 13 as an example of the electronic circuit in the radar system according to the present embodiment. The modulator 13 includes a transistor T1 of HEMT. The modulator 13 further includes a capacitor C1, a capacitor C2, a capacitor C3, an inductor L1, a resistance R1, a resistance R2, a resistance element for detection R3, a gate voltage switching portion 41, a matching circuit 42 and a voltage measurement circuit 43.

One end of the capacitor C2 and one end of the inductor L1 are connected to a gate electrode of the transistor T1. One end of the capacitor C1 is connected to the other end of the inductor L1, and the remaining end of the capacitor C1 is grounded. The carrier wave 51 amplified by the transmission amplifier 12 is inputted into the gate electrode of the transistor T1 via the capacitor C2. The inductor L1 and the capacitor C1 have a filtering function so as to prevent an alternating current component from flowing into the power supply system, which gives gate voltage Vg. The gate voltage switching portion 41 is a changeover switch for switching the applied gate voltage Vg between an operating voltage V1 (for example, −0.2 V) and a checking voltage V2 (for example, −1 V). Switching control of the gate voltage switching portion 41 is performed by a control circuit 31. A common terminal 41C, which is one of the switches included in the gate voltage switching portion 41, is connected to the gate electrode of the transistor T1 via the inductor L1. A switching terminal 41A, which is another one of the switches included in the gate voltage switching portion 41, is connected to a power supply for the operating voltage V1 via the resistance R2, and a switching terminal 41B, which is the other of the switches included in the gate voltage switching portion 41, is connected to a power supply for the checking voltage V2. The remaining end of the switching terminal 41A of the gate voltage switching portion 41 is connected to one end of the resistance R1. The modulated pulse signal 52 from the signal processing section 10 is inputted via the resistance R1 into the switching terminal 41A of the gate voltage switching portion 41.

The capacitor C3 and the matching circuit 42 are connected to the drain electrode side of the transistor T1. The transmission pulse signal is outputted from the drain electrode of the transistor T1 via the capacitor C3 and the matching circuit 42.

The resistance element for detection R3 is disposed between a power supply that gives a drain voltage Vd to the drain electrode and the drain electrode of the transistor T1. The voltage measurement circuit 43 measures the voltage across both ends of the resistance element for detection R3. A current value calculation section 31A of the control circuit 31 calculates a current value of the drain current Id of the transistor T1 based on a voltage value measured in the voltage measurement circuit 43. The current value can be calculated as a quotient obtained from dividing the voltage value across the ends of the resistance element for detection R3 by a resistance value thereof. A failure determination section 31B of the control circuit 31 determines whether or not the transistor T1 has a failure based on the current value. How to determine the failure will be mentioned more specifically later in FIG. 3.

The control circuit 31 further has a function to implement switching control of the gate voltage switching portion 41 and control of the trouble notice section 32. The trouble notice section 32 is typically constituted by display means for indicating on its screen an occurrence of malfunction and sound output means for telling the occurrence of malfunction by warning beep so that notification of malfunction can be given appropriately to the people around when something is wrong with the transistor, in accordance with the control of the control circuit 31.

It is to be noted each of the high frequency circuit portions other than the modulator 13 also has the resistance element for detection R3 and the voltage measurement circuit 43 in a similar manner. Also, the control circuit 31 is configured to make a determination of failure based on the current value of drain current Id for the other high frequency circuit portions than the modulator 13, similar to the modulator 13.

Here, in the present embodiment, the gate voltage switching portion 41 corresponds to a specific example of the "switching means" of the present invention. The combination of the resistance element for detection R3, the voltage measurement circuit 43 and the current value calculation section 31A correspond to a specific example of the "detection means" of the present invention. The failure determination section 31B corresponds to a specific example of the "determination means" of the present invention. The control circuit 31 corresponds to a specific example of the "control means" of the present invention.

Figure 3:
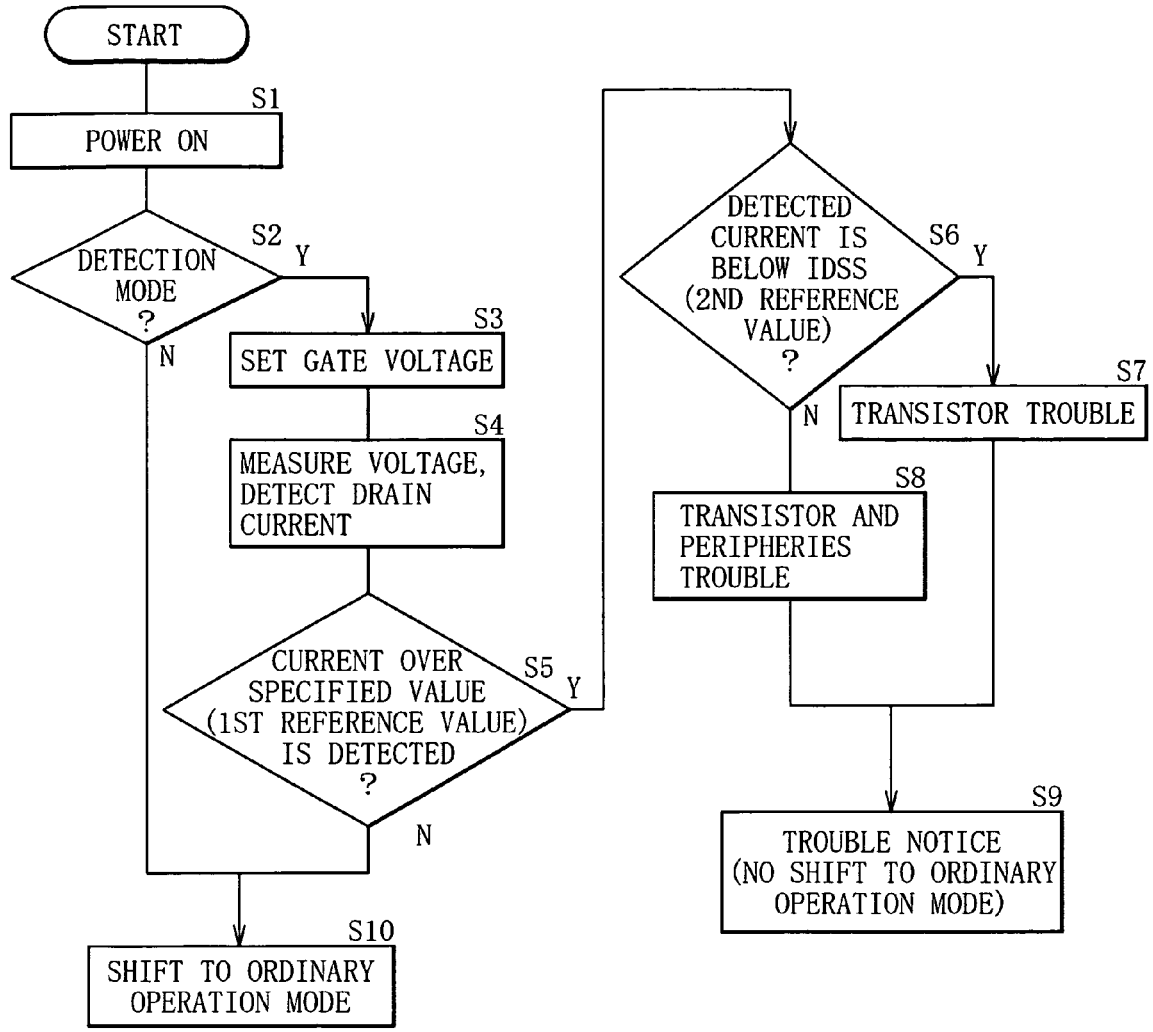
FIG. 3 is a flow chart explaining a failure detection process according to the first embodiment of the present invention.

Next, operation of failure detection in the radar system will be explained. FIG. 3 shows an example of the failure detection process. The radar system has two kinds of modes for operating the system, a normal operation mode and a detection mode. For more simple description, only a case where the modulator 13 of FIG. 2 is inspected is explained herein, and the other circuit portions may be inspected in a similar manner. Namely, the other high frequency circuit portions also go through a similar process for failure determination successively. When the control circuit 31 determines that all the high frequency circuit portions are trouble-free, it will re-set the operating state of the whole system to the normal operation mode to shift into the normal operation mode.

Figure 12:
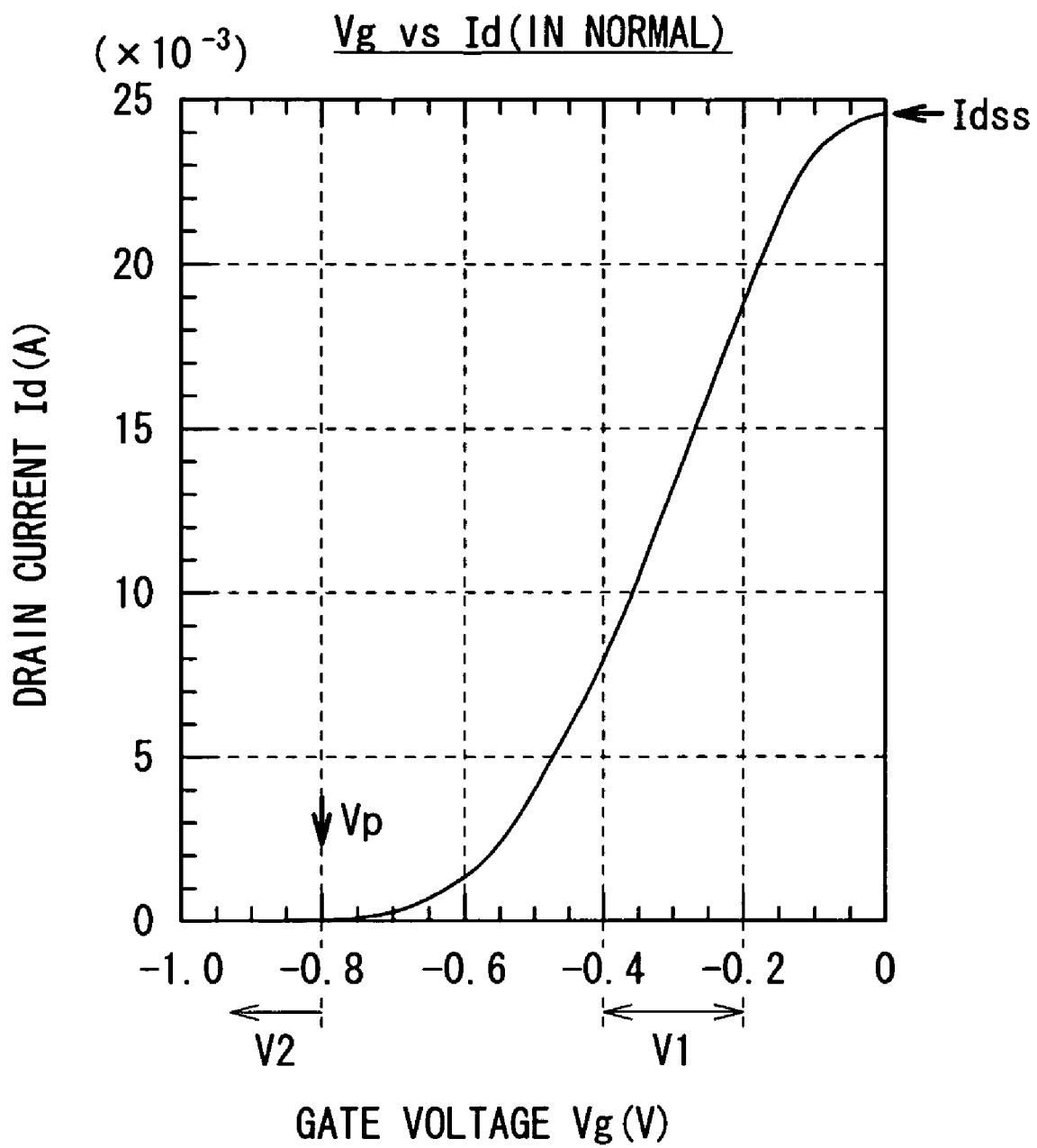
FIG. 12 is a characteristic chart showing an example of gate voltage Vg versus drain current Id characteristic when the transistor is trouble-free.

When powering on (in step S1), the control circuit 31 sets the operating state of the system to the detection mode, as its initial motion at the time of powering on (in step S2: Y). The way to enter the detection mode is not limited to the initial-motion-setting at the time of Powering-ON, and the detection mode can be set so as to be entered any time. For example, an operation portion which gives an instruction to enter the detection mode may be additionally provided so that users can give instruction to enter the detection mode any time they like using the operation portion. In this case, if there is no instruction to enter the detection mode (in step S2: N), the control circuit 31 sets the operating state of the system to the normal operation mode so as to shift into the normal operation mode (in step S10). In the normal operation mode, the control circuit 31 controls the gate voltage switching portion 41 so that the gate voltage Vg applied to the transistor T1 is set to the operating voltage V1. The operating voltage V1 in the normal operation mode is typically set to about −0.2 V to −0.4 V, as shown in FIG. 12.

Figure 13:
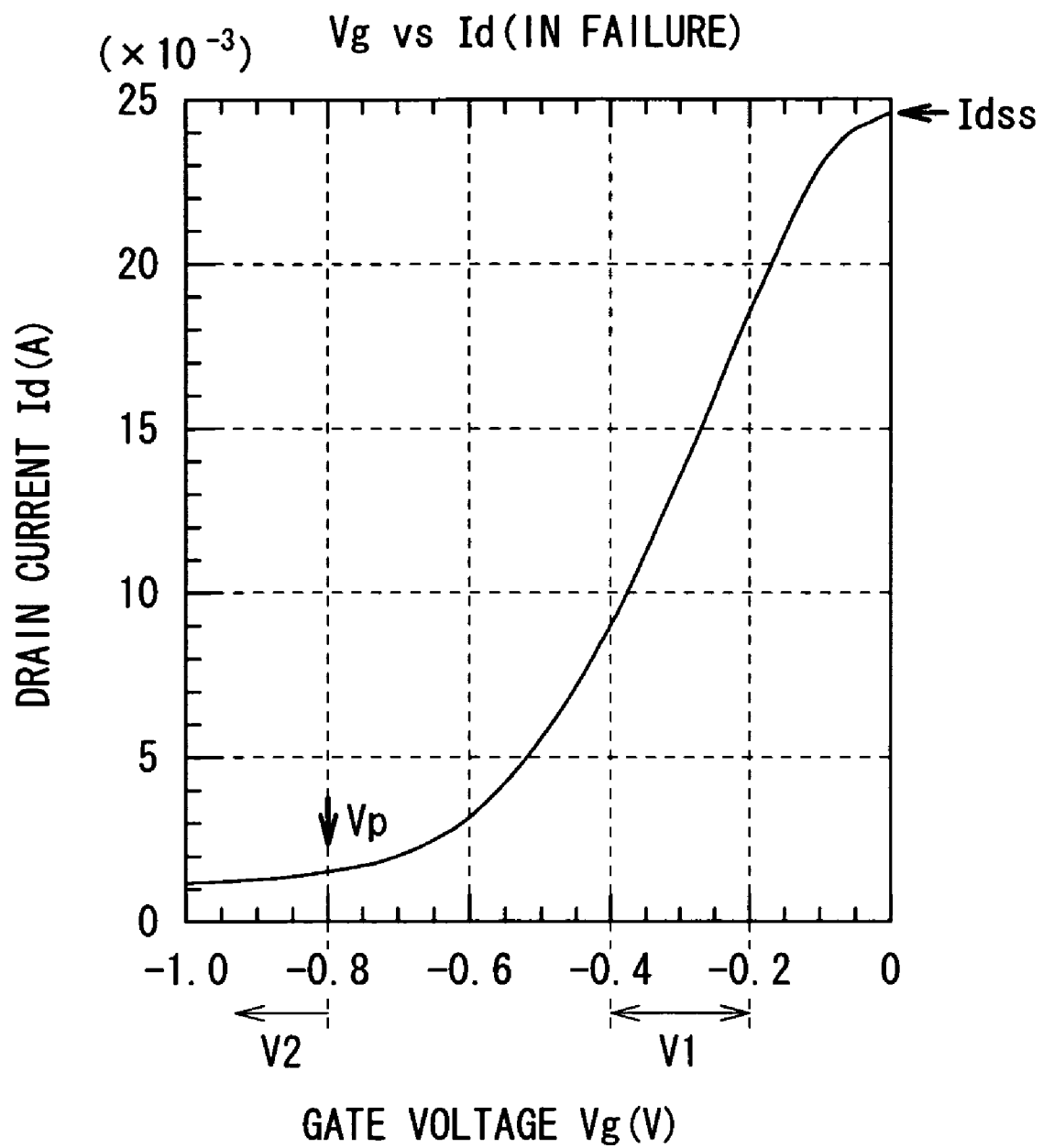
FIG. 13 is a characteristic chart showing an example of gate voltage Vg versus drain current Id characteristic when the transistor has a failure.

Meanwhile, in the detection mode, the control circuit 31 controls the gate voltage switching portion 41 so that the gate voltage Vg applied to the transistor T1 is set to the checking voltage V2 (in step S3). The checking voltage V2 is typically set to a pinch-off-voltage Vp of the transistor T1, or between the pinch-off-voltage Vp and a maximum rated voltage (−3 V for example), as shown in FIG. 12. That is because failure mode of the transistor T1 as shown in FIG. 13 can be detected more easily when the checking voltage V2 is set in that range. When the absolute value of the gate voltage Vg is larger than the pinch-off-voltage Vp with the transistor T1 of a normal mode as shown in FIG. 12, the current value of drain current Id becomes smaller than a given value (for example, about 1 mA). On the other hand, when a similar checking voltage V2 is applied to the transistor T11 of a failure mode as shown in FIG. 13, the drain current Id exceeding the given value flows. When such drain current Id flows, a voltage drop occurs across the ends of the resistance element for detection R3, thereby failure mode can be detected more easily.

The control circuit 31 detects the current value of the drain current Id flown when the above-mentioned checking voltage V2 is applied (in step S4). More specifically, the voltage value, which is obtained when the checking voltage V2 is applied across the ends of the resistance element for detection R3, is measured by the voltage measurement circuit 43, then the current value calculation section 31A of the control circuit 31 calculates the current value of drain current Id based on the voltage value. Next, the failure determination section 31B of the control circuit 31 determines whether or not the detected current value is larger than a given value (a first reference value) (in step S5). It is preferred that the "first reference value" mentioned here is set to a maximum current value (for example 1 mA) flowing in the trouble-free transistor T1 when the gate voltage Vg is set to the pinch-off-voltage Vp, as described above. When it is determined by the failure determination section 31B of the control circuit 31 that the current value of drain current Id is equal to or below the first reference value (in step S5: N), the control circuit 31 sets the operating state of the system to the normal operation mode to shift its operation into the normal operation mode (in step S10). In this case, the control circuit 31 controls the gate voltage switching portion 41 so that the gate voltage Vg applied to the transistor T1 may be set to the operating voltage V1.

When the current value of drain current Id exceeding the first reference value is detected (in step S5: Y), the failure determination section 31B of the control circuit 31 then compares the current value with the second reference value (in step S6). It is preferred that the "second reference value" mentioned here is set to a maximum current value the trouble-free transistor T1 can take (Idss, which is the maximum value of the drain current Id when the gate voltage Vg is zero), as shown in FIG. 12. When the comparison results in that the current value exceeds the first reference value and is below the second reference value (in step S6: Y), the failure determination section 31B of the control circuit 31 determines that a failure mode peculiar to the transistor T1 has occurred and that is attributed to the transistor T1 itself (in step S7). Then the control circuit 31 controls the trouble notice section 32 so as to appropriately notify an occurrence of trouble to people around by display or warning beep.

If the detected current value exceeds not only the first reference value but also the second reference value (in step S6: N), the failure determination section 31B of the control circuit 31 determines that there may be a failure not only in the transistor T1 but also in peripheral circuits thereof connected thereto directly or indirectly (in step S9) because it is known that a gate of the transistor T1 cannot control the drain current Id at all. Then the control circuit 31 controls the trouble notice section 32 so as to appropriately notify an occurrence of trouble to the people around by use of display or warning beep.

As explained above, in the radar system of the present invention, unlike the related art of implementing a failure detection in the ordinary operation states, failure detection is implemented based on the current value of drain current Id flown when the checking voltage V2, which is set up apart from the operating voltage V1, is applied as the gate voltage Vg. In this manner, failure mode peculiar to a high electron mobility transistor (transistor T1), which is hardly detectable in the ordinary operation state, becomes detectable. Accordingly, when it is used as a vehicle-mounted radar for example, failure detection prior to actual operation is available, thereby improving safety for operation.

Figure 4:
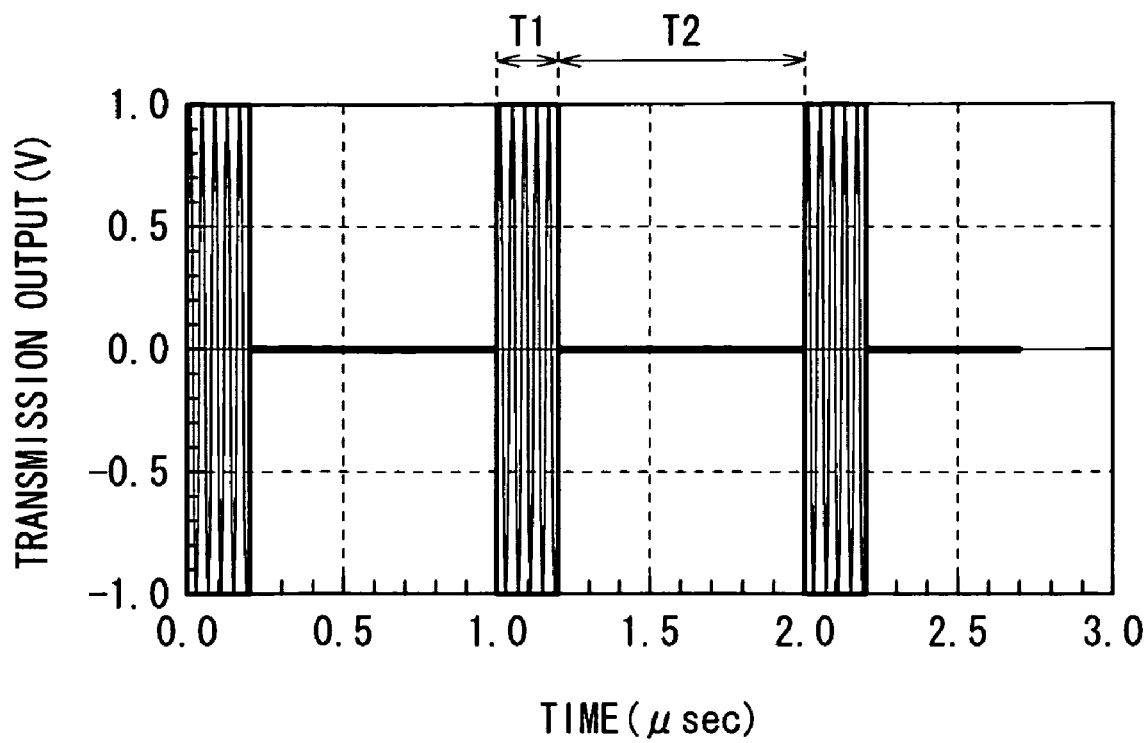
FIG. 4 is a waveform chart showing an example for a trouble-free transmission pulse signal.
Figure 5:
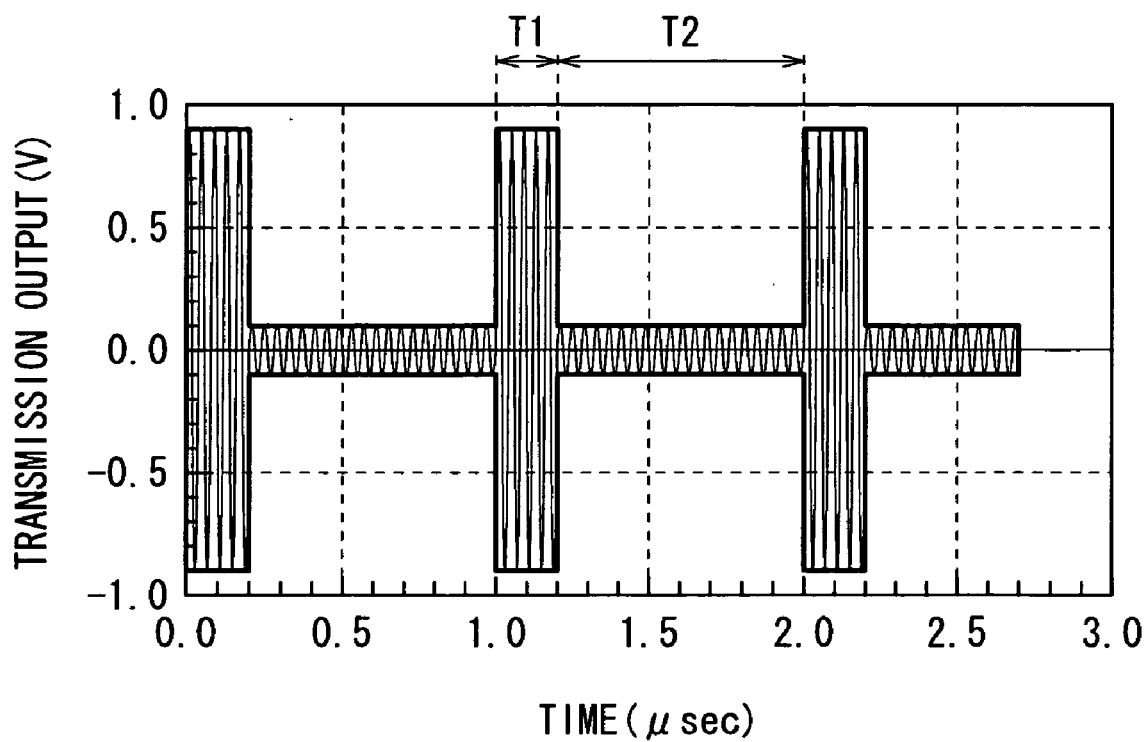
FIG. 5 is a waveform chart showing an example a transmission pulse signal when something is wrong.

FIG. 4 shows an example of an ideal transmission pulse signal emitted from the modulator 13 of the radar system in trouble-free condition. Meanwhile, FIG. 5 shows an example of the transmission pulse signal when the transistor T1 of the modulator 13 has a failure. The abscissa shows time and the coordinate shows output value. As shown in FIG. 4, the output value of a normally-outputted transmission pulse signal is clearly discriminable between ON periods T1 and OFF periods T2 of the pulse because it is zero in the OFF periods T2. On the other hand, as shown in FIG. 5, when there is a failure in the transistor T1 (when the failure mode as shown in FIG. 13 occurs for example), the output value decreases in the ON periods T1 of the pulse while some values are generated in the OFF period T2. Thus, when such a transmission pulse signal as shown in FIG. 5 is outputted as the transmission wave due to the failure in the high frequency circuit portions in the transmitter, it may become difficult for the receiver to well discriminate the pulse, thereby proper function of the radar system may become difficult. When a failure occurs in the high frequency circuit portions in the receiver, even if there is no failure in the transmitter, some troubles such as gain decrease may occur, thereby proper function of the radar system may become difficult also in this case. Since failure detection before actual operation, which has been difficult for the related art, is available in the present embodiment, it can be applied to a vehicle-mounted radar system to improve safety for operation.

Second Embodiment

Next, a second embodiment will be described. Same reference numerals as in the above first embodiment have been used to indicate substantially identical components, thereby some descriptions are appropriately omitted.

Figure 6:
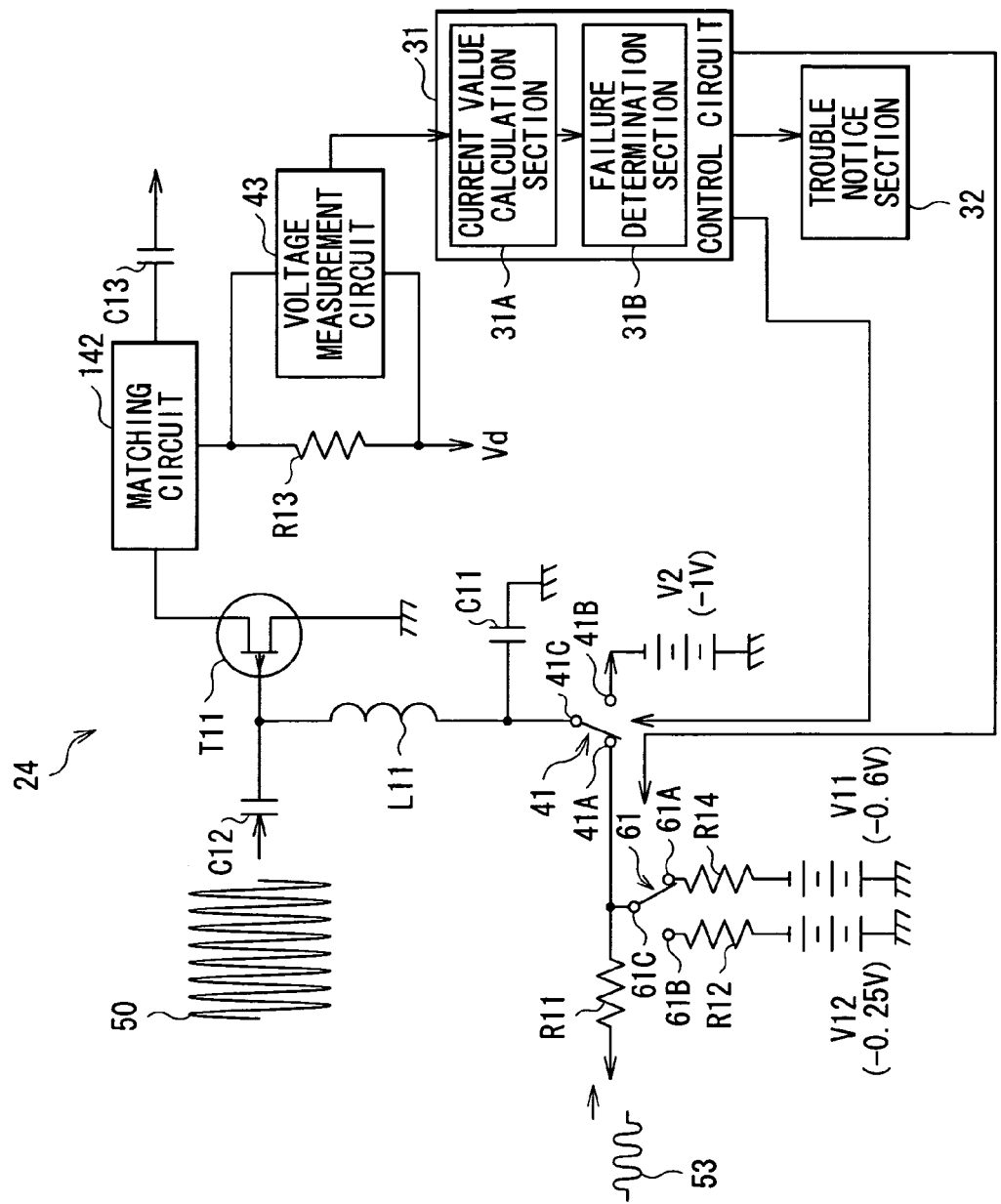
FIG. 6 is a circuit diagram showing one configuration example of an electronic circuit in the radar system according to a second embodiment of the present invention.

FIG. 6 shows one configuration example of an electronic circuit in the radar system according to the present embodiment. Although in the above-mentioned first embodiment was shown the configuration example (FIG. 2) of the modulator 13 in the transmitter as an example of electronic circuits using HEMT therein, FIG. 6 shows a specific configuration example of mixer 24 in the receiver, as an example of the electronic circuits using HEMT. It is to be noted that the whole configuration of the radar system according to the present embodiment is the same as that of FIG. 1.

The mixer 24 includes a transistor T11 of HEMT as with the modulator 13 shown in FIG. 2. The mixer 24 also includes a gate voltage switching portion 41 and a voltage measurement circuit 43 as with the modulator 13. The mixer 24 further includes a capacitor C11, capacitor C12, capacitor C13, inductor L11, resistance R11, resistance element for detection R13, and a matching circuit 142 as well. These have the same function as that of the capacitor C1, capacitor C2, capacitor C3, the inductor L1, the resistance R1, the resistance R2, the resistance element for detection R3, and the matching circuit 42 provided in the modulator 13. However, the resistance element for detection R13 also functions as a drain current limiting resistance.

The mixer 24 further has an operating voltage switching portion 61. The operating voltage switching portion 61 is a switch to change the gate voltage Vg applied to the transistor T11 between a first operating voltage V11 and a second operating voltage V12 instead of the operating voltage V1 in the modulator 13. The first operating voltage V11 is an ordinary operating voltage to be applied when there is no failure in the transistor T11, and related to an after-mentioned first operating voltage region (−0.6 V, for example). The second operating voltage V12 is applied when the transistor T11 has a failure, and related to an after-mentioned second operating voltage region (−0.25 V for example).

Switching control of the operating voltage switching portion 61 is implemented by a control circuit 31 as with the gate voltage switching portion 41. A common terminal 61C, which is a switch part of the operating voltage switching portion 61, is connected to the gate electrode of the transistor T11 via the gate voltage switching portion 41 and the inductor L11. The common terminal 61C of the operating voltage switching portion 61 is also connected to one end of the resistance R11. One switching terminal 61A, which is a switch part of the operating voltage switching portion 61, is connected via a resistance R14 to a power supply that provides the first operating voltage V11, and the other switching terminal 61B is connected via a resistance R12 to a power supply that provides the second operating voltage V12.

In the present embodiment, the gate voltage switching portion 41 and the operating voltage switching portion 61 correspond to a specific example of the "switching means" according to the present invention. Although the switching means is constituted by two separate portions, the gate voltage switching portion 41 and the operating voltage switching portion 61 as shown in FIG. 6, these may be combined as one component for switching.

In this mixer 24, the received pulse signal 53 amplified by the high-frequency amplifiers 22 and 23 of FIG. 1 is inputted into the gate electrode of the transistor T11 from a switching terminal 41A, which is one of the switches for the gate voltage switching portion 41 via the resistance R11. The local oscillation wave 50 emitted from the local oscillator 11 is inputted into the gate electrode of the transistor T11 via the capacitor C12.

Figure 7:
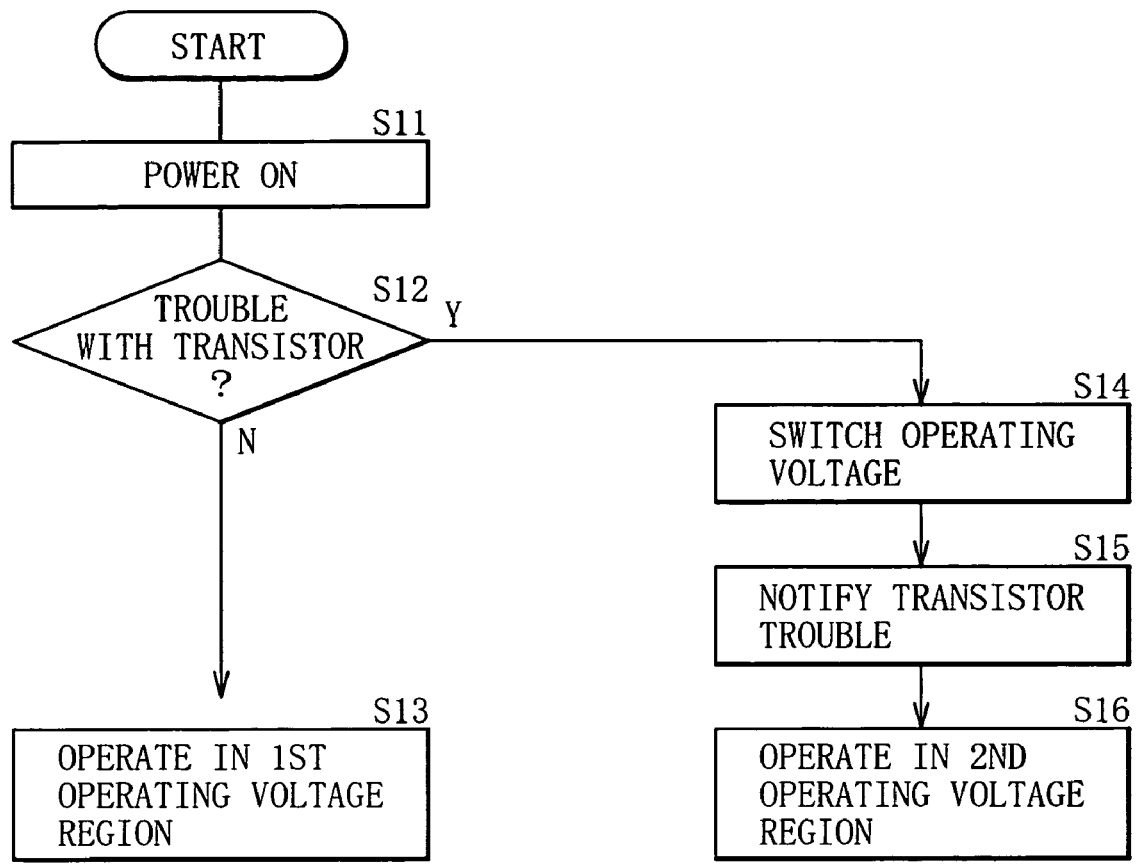
FIG. 7 is a flow chart explaining a process of switching operating voltage according to the second embodiment of the present invention.

FIG. 7 shows a switching process for the operating voltage implemented in the mixer 24. Here, when powering on (in step S11), the control circuit 31 determines whether or not there is a failure in the transistor T11 as with the above-mentioned first embodiment. When it is determined that the transistor T11 has no failure (trouble) (in step S1: N), the control circuit 31 implements a switching control of the gate voltage switching portion 41 and the operating voltage switching portion 61 so that the first operating voltage V11 can be applied as gate voltage Vg for the transistor T11. After that, the mixer 24 is being operated with the first operating voltage V11 (in step S13). On the other hand, when it is determined that the transistor T11 has a failure (trouble) (in step S12: Y), the control circuit 31 implements a switching control of the gate voltage switching portion 41 and the operating voltage switching portion 61 so that the second operating voltage V12 can be applied as gate voltage Vg for the transistor T11 (in step S14), and also controls a trouble notice section 32 to appropriately warn to people around that something is wrong with the transistor T11 by way of displaying or warning beep and so on (in step S15). After that, the mixer 24 is being operated with the second operating voltage V12 (in step S16). In this manner, it becomes possible to obtain a conversion gain similar to that obtained during the ordinary operation at the first operating voltage V11 (the ordinary operating voltage), by switching to the second operating voltage V12, which is defined suitably as described later, even when some failure occurs in the transistor T11. Accordingly, it becomes possible for the electronic circuit to avoid deterioration in performance even at the time of failure.

Figure 8:
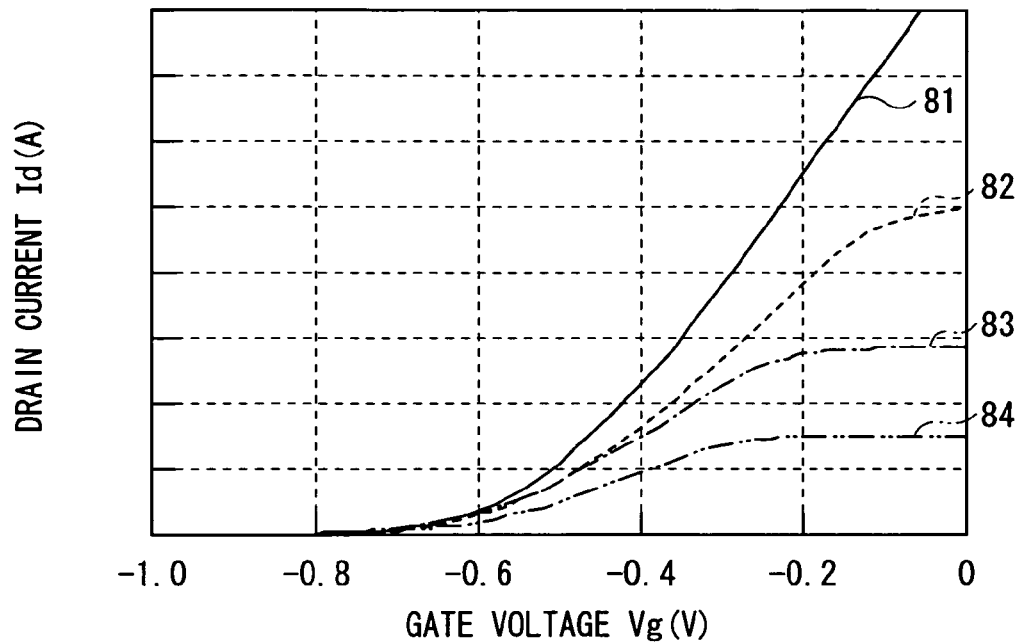
FIG. 8 is a characteristic chart showing an example of gate voltage Vg versus drain current Id characteristic for each resistance when a transistor is trouble-free, with a drain current limiting resistance provided.
Figure 9:
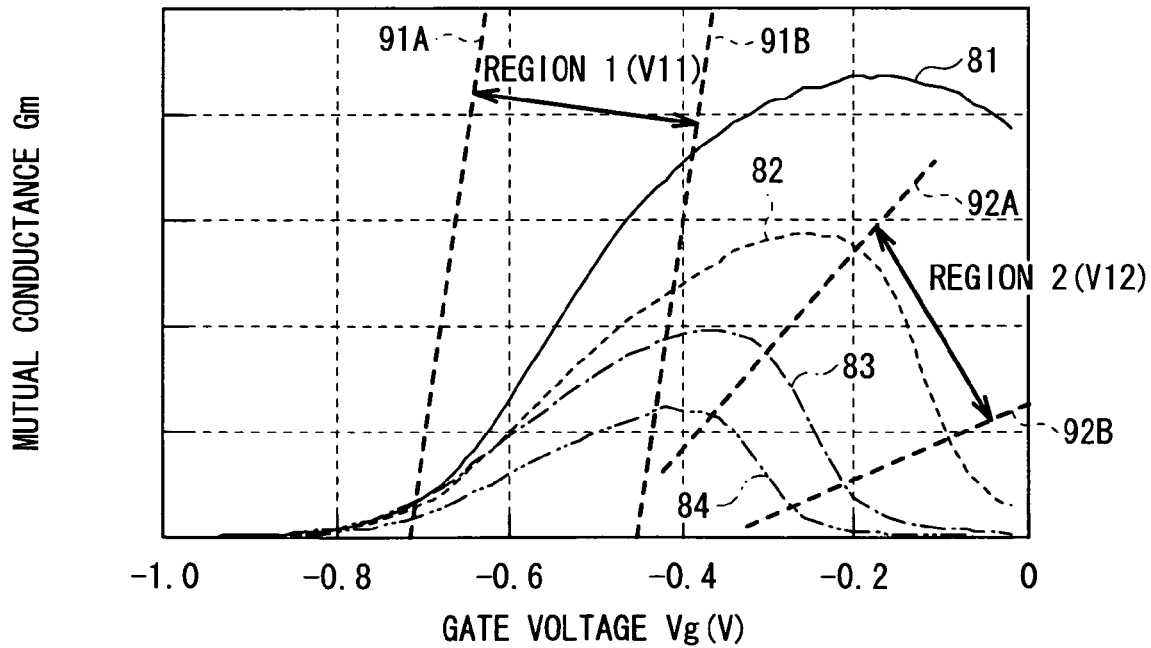
FIG. 9 is a characteristic chart showing an example of gate voltage Vg versus mutual conductance Gm characteristic for each resistance, when the transistor is trouble-free, with the drain current limiting resistance provided.
Figure 11:
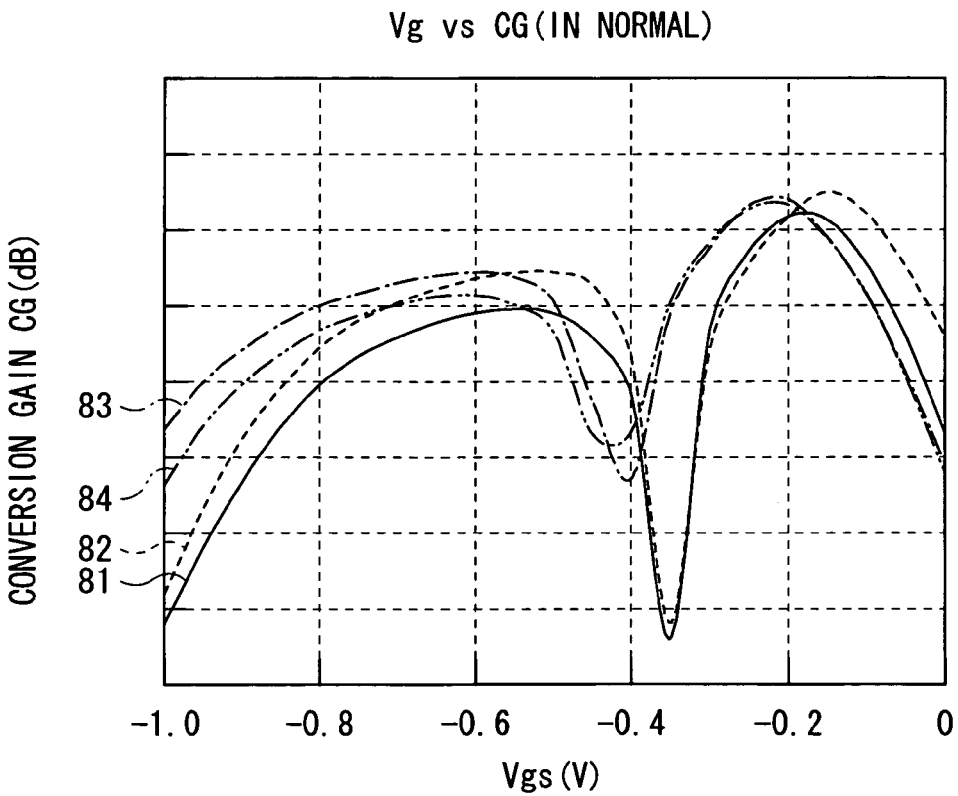
FIG. 11 is a characteristic chart showing an example of gate to source voltage Vgs versus conversion gain CG characteristic for each resistance when the transistor is trouble-free, with the drain current limiting resistance provided.

Next, the first operating voltage V11 and the second operating voltage V12 are explained in detail hereinbelow. FIG. 8 shows an example of gate voltage Vg versus drain current Id characteristic (Vg-Id characteristic) for each resistance when the transistor T11 is trouble-free, with a drain current limiting resistance (namely, the resistance element for detection R13 appearing in FIG. 6) provided. FIG. 9 shows an example of gate voltage Vg versus mutual conductance Gm characteristic (namely, gradient of the Vg-Id characteristic) for each resistance when the transistor T11 is trouble-free, with the drain current limiting resistance provided. It is to be noted that the characteristic curve denoted by reference numeral 81 represents a case of the lowest current-limiting resistance; the current-limiting resistance becomes higher as the reference numerals increase from 81 to 84 in this order. FIG. 11 shows an example of gate to source voltage Vgs versus conversion gain CG characteristic for each resistance when the transistor T11 is trouble-free, with the drain current limiting resistance provided. Here, CG (conversion gain) corresponds to a magnitude of the gradient of the mutual conductance Gm characteristic curve.

As shown in FIGS. 9 and 11, the larger the variation of the mutual conductance Gm is with respect to the increase of the gate voltage, the higher conversion gain CG the mixer 24 in the receiver is achieved. As shown in FIG. 9, significant variation in the mutual conductance Gm appears in two regions, Region 1 and Region 2. Region 1 (first voltage region) is a region where gradient of the characteristic curve of the mutual conductance Gm is positive, and more preferably, not only positive but also the greatest (substantially, that is an area defined by the auxiliary lines 91A and 91B in FIG. 9, where the mutual conductance Gm varies almost linearly). Region 2 (second voltage region) is a region where gradient of the characteristic curve of the mutual conductance Gm is negative, and more preferably, not only negative but also the greatest (substantially, that is an area defined by the auxiliary lines 92A and 92B in FIG. 9, where the mutual conductance Gm varies almost linearly). In this case, as is evident from FIGS. 8 and 9, amount of the drain current Id is smaller in Region 1 of a positive and greatest gradient than Region 2. Namely, operation in Region 1 can achieve high conversion gain CG with a smaller power consumption. For this reason, Region 1 is used as the operating voltage for normal mixers. For more efficient power consumption, nonlinear portion close to the pinch-off-voltage Vp is used as the operating voltage. Accordingly, Region 1 is applied to the first operating voltage V11 as well for the mixer 24 according to the present embodiment.

Here, since Region 1 is an area close to the pinch-off-voltage Vp, if failure occurs in the transistor T11 showing such a characteristic as shown in FIG. 13, a significant gain decrease occurs. When a failure occurs in the transistor T11, there appear two characteristic-changes: one with a reduction of the pinch-off-voltage Vp; and the other with an increase in the drain current Id flown at the operating voltage. Such characteristic-changes may reduce the variation of the mutual conductance Gm in its operating region, thereby it becomes difficult for the mixer to achieve enough conversion gain. As a result, sensitivity deterioration may occur in the receiver, and further leading to performance deterioration in the whole system.

Figure 10:
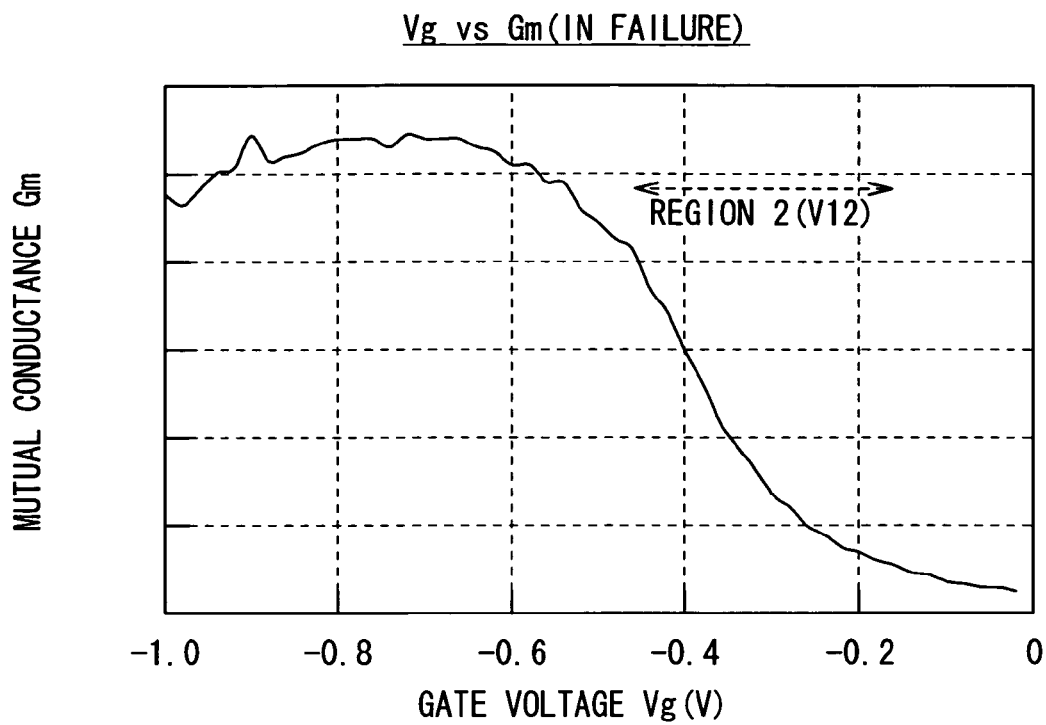
FIG. 10 is a characteristic chart showing an example of gate voltage Vg versus mutual conductance Gm characteristic when the transistor has a failure, with the drain current limiting resistance provided.

FIG. 10 is a characteristic chart showing an example of gate voltage Vg versus mutual conductance Gm characteristic when the transistor T11 has a failure, with the drain current limiting resistance provided. Here, the form of the characteristic curve denoted by reference numeral 83 of FIG. 9, for example, is changed into that of FIG. 10. As shown in FIG. 10, variation of mutual conductance Gm decreases in the area related to Region 1 (characteristic is changed compared with the normal case). Meanwhile, in Region 2, variation of mutual conductance Gm is still large enough (namely, there appears little difference in the characteristic compared with the normal case). For this reason, operation in Region 2 makes it possible for the mixer to attain high conversion gain enough for its good operation even when the transistor T11 has a failure, although the consumed electric current increases. Accordingly, Region 2 is applied to the second operating voltage V12 for the mixer 24 of the present embodiment.

As explained above, the radar system according to the present embodiment is operable, even when there is a failure in the transistor T11, by switching its operating voltage to the voltage V12 in the suitably-defined second voltage region. In this manner, it is possible to achieve a conversion gain similar to the case of voltage V11 in the first voltage region, thereby avoiding performance deterioration as an electronic circuit even at the time of failure.

Other Embodiments

The present invention is not limited to the above embodiments as various modifications are available. For example, the present invention is applicable not only to the radar system of a pulse modulation method but other methods. For example, it is also applicable to the radar system of FM-CW (Frequency Modulated-Continuous Wave) method. In the FM-CW radar, the relative distance and relative velocity to a detection target is detected in such a manner as to transmit a frequency-modulated continuous wave, generate a beat signal by receiving the signal reflected from the detection target and synthesizing it with a transmission signal, and analyze the beat signal.

In each of the above-mentioned embodiments, although explanation is made only about an electronic circuit using one high electron mobility transistor therein, the present invention is applicable also to an electronic circuit having a plurality of high electron mobility transistors therein. In this case, what is necessary is just to implement the failure detection process similar to the above-mentioned embodiments for each of the plurality of high electron mobility transistors.

Obviously many modifications and variations of the present invention are possible in the light of the above teachings. It is therefore to be understood that within the scope of the appended claims the invention may be practiced otherwise than as specifically described.

What is claimed is:

1. A radar system for detecting a detection target by emitting a transmission wave and receiving a reflected wave reflected from the detection target, the radar system comprising at least one electronic circuit employing a high electron mobility transistor, the electronic circuit including:
switching means for switching a gate voltage to be applied to the high electron mobility transistor, between an operating voltage and a checking voltage, detection means for detecting the current value of a drain current in the high electron mobility transistor under application of the checking voltage, and determination means for determining occurrence of failure in the high electron mobility transistor by comparing the detected current value with a first reference value.

2. The radar system according to claim 1, further comprising control means for implementing a switching control of the switching means, wherein the control means controls the switching means so that the operating voltage is applied as the gate voltage for the high electron mobility transistor when the determination means determined that no failure occurs.

3. The radar system according to claim 2, wherein the operating voltage is a voltage defined within a first voltage region where gradient of a characteristic curve indicative of mutual conductance versus gate voltage for the high electron mobility transistor is positive.

4. The radar system according to claim 3, wherein the electronic circuit is a mixer circuit arranged in a receiver receiving the reflected wave.

5. The radar system according to claim 2, wherein the switching means further has a function of switching the operating voltage between a voltage in a first voltage region where gradient of a characteristic curve indicative of mutual conductance versus gate voltage for the high electron mobility transistor is positive, and another voltage in a second voltage region distinct from the first voltage region, and when it is determined by the determination means that failure has occurred in the high electron mobility transistor, the control means controls the switching means to apply, as the operating voltage, a voltage in the second voltage region, as the gate voltage for the high electron mobility transistor.

6. The radar system according to claim 5, wherein the second voltage region is a field where gradient of the characteristic curve is negative.

7. The radar system according to claim 6, wherein the second voltage region is a field where gradient of the characteristic curve is negative maximum.

8. The radar system according to claim 1, wherein the determination means compares the detected current value with a second reference value, and if the current value exceeds the first reference value and is not over the second reference value, the determination means determines that a failure mode peculiar to the high electron mobility transistor has occurred.

9. The radar system according to claim 1, further comprising a peripheral circuit connected to the high electron mobility transistor directly or indirectly, wherein the determination means compares the detected current value with the second reference value, and if the current value exceeds the second reference value, the determination means determines that failure has occurred in both of the high electron mobility transistor and the peripheral circuit.

10. The radar system according to claim 1, wherein the value of the checking voltage is set to the value of a pinch off voltage or between the pinch off voltage and a maximum rated voltage of the high-electron mobility transistor.

* * * * *